United States Patent
Tang

(10) Patent No.: US 9,490,124 B2
(45) Date of Patent: Nov. 8, 2016

(54) POLYCRYSTALLINE SILICON SUBSTRATE AND MANUFACTURING METHOD THEREOF

(71) Applicant: Shenzhen China Star Optoelectronics Technology Co., Ltd., Shenzhen, Guangdong (CN)

(72) Inventor: Lijuan Tang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/433,656

(22) PCT Filed: Jan. 5, 2015

(86) PCT No.: PCT/CN2015/070103
§ 371 (c)(1),
(2) Date: Apr. 4, 2015

(87) PCT Pub. No.: WO2016/106786
PCT Pub. Date: Jul. 7, 2016

(65) Prior Publication Data
US 2016/0189961 A1  Jun. 30, 2016

(30) Foreign Application Priority Data
Dec. 30, 2014 (CN) .......................... 2014 1 0850901

(51) Int. Cl.
*H01L 21/331* (2006.01)
*H01L 21/02* (2006.01)
*H01L 21/324* (2006.01)
*H01L 21/225* (2006.01)
*H01L 29/16* (2006.01)
*H01L 29/04* (2006.01)

(52) U.S. Cl.
CPC ...... *H01L 21/02672* (2013.01); *H01L 21/0217* (2013.01); *H01L 21/02126* (2013.01); *H01L 21/02164* (2013.01); *H01L 21/02532* (2013.01); *H01L 21/02592* (2013.01); *H01L 21/02694* (2013.01); *H01L 21/2254* (2013.01); *H01L 21/3247* (2013.01); *H01L 29/04* (2013.01); *H01L 29/16* (2013.01)

(58) Field of Classification Search
USPC .............................. 438/365, 166, 96, 97, 149
See application file for complete search history.

(56) References Cited

U.S. PATENT DOCUMENTS

2010/0219415 A1* 9/2010 Park .................. H01L 21/02488
257/72

* cited by examiner

*Primary Examiner* — Timor Karimy
(74) *Attorney, Agent, or Firm* — Andrew C. Cheng

(57) ABSTRACT

The present invention discloses a polycrystalline silicon substrate and a manufacturing method thereof. The method comprises: provide a substrate; sequentially form an amorphous silicon layer, an insulating layer and a metal catalyst layer; anneal the substrate at the first time, so that metal ions of the metal catalyst layer extend down to the amorphous silicon layer through the insulating layer, thereby inducing the amorphous silicon on the amorphous silicon layer to crystallize at the first time; remove the insulating layer and the metal catalyst layer; anneal the substrate at the second time, so that the metal ions lateral diffuse along the amorphous silicon layer, thereby inducing the amorphous silicon on the amorphous silicon layer to crystallize at the second time, forming the polycrystalline silicon layer. Through the above way, it can reduce the metal catalyst residues during forming the polycrystalline silicon layer, decreasing the leakage current of the semiconductor layer in the thin film transistor, thereby raising the performance of the thin film transistor.

18 Claims, 4 Drawing Sheets

POLYCRYSTALLINE SILICON SUBSTRATE AND MANUFACTURING METHOD THEREOF

BACKGROUND OF THE INVENTION

1. Field of the Invention

The present invention relates to a semiconductor producing technical field, and in particular to a polycrystalline silicon substrate and a manufacturing method thereof.

2. The Related Arts

Currently, the methods of crystalizing the amorphous silicon thin-film to the polycrystalline silicon mainly are SPC, MIC, MILC, RTA and ELA. Wherein MIC and MILC can obtain the fine polycrystalline silicon crystals; therefore, these methods are more popular. However, it exists metal catalyst residues during the crystallization process by using MIC and MILC, thereby causing the leakage current of the semiconductor layer in the thin film transistor, affecting the performance of the thin film transistor.

SUMMARY OF THE INVENTION

In view of this, the present invention provides a polycrystalline silicon substrate and a manufacturing method thereof, it can reduce the metal ion residues of the metal catalyst, decreasing the leakage current of the semiconductor layer in the thin film transistor, thereby raising the performance of the thin film transistor.

In order to solve the above issues, the present invention provides a manufacturing method of a polycrystalline silicon substrate, the manufacturing method comprises: provide a substrate; sequentially form an amorphous silicon layer, an insulating layer and a metal catalyst layer; anneal the substrate at the first time, so that metal ions of the metal catalyst layer extend down to the amorphous silicon layer through the insulating layer, thereby inducing the amorphous silicon on the amorphous silicon layer to crystallize at the first time; remove the insulating layer and the metal catalyst layer; anneal the substrate at the second time, so that the metal ions lateral diffuse along the amorphous silicon layer, thereby inducing the amorphous silicon on the amorphous silicon layer to crystallize at the second time, forming the polycrystalline silicon layer; wherein the step before annealing the substrate at the first time further comprises: pattern the metal catalyst layer; wherein the step after annealing the substrate at the second time further comprises: pattern the polycrystalline silicon layer.

Wherein the step before sequentially forming an amorphous silicon layer, an insulating layer and a metal catalyst layer further comprises: form a buffer layer on the substrate; the step of sequentially forming an amorphous silicon layer, an insulating layer and a metal catalyst layer comprises: form the amorphous silicon layer, the insulating layer and the metal catalyst layer on the buffer layer.

In order to solve the above issues, the present invention provides another manufacturing method of a polycrystalline silicon substrate, the manufacturing method comprises: provide a substrate; sequentially form an amorphous silicon layer, an insulating layer and a metal catalyst layer; anneal the substrate at the first time, so that metal ions of the metal catalyst layer extend down to the amorphous silicon layer through the insulating layer, thereby inducing the amorphous silicon on the amorphous silicon layer to crystallize at the first time; remove the insulating layer and the metal catalyst layer; anneal the substrate at the second time, so that the metal ions lateral diffuse along the amorphous silicon layer, thereby inducing the amorphous silicon on the amorphous silicon layer to crystallize at the second time, forming the polycrystalline silicon layer.

Wherein the first annealing temperature is 500-600° C.

Wherein the second annealing temperature is 500-600° C.

Wherein the step before sequentially forming an amorphous silicon layer, an insulating layer and a metal catalyst layer further comprises:
  form a buffer layer on the substrate;
  the step of sequentially forming an amorphous silicon layer, an insulating layer and a metal catalyst layer comprises:
  form the amorphous silicon layer, the insulating layer and the metal catalyst layer on the buffer layer.

Wherein the buffer layer is at least one or any combination of the silicon oxide, silicon nitride and silicon oxynitride.

Wherein the insulating layer is at least one or any combination of the silicon oxide, silicon nitride and silicon oxynitride.

Wherein the metal catalyst layer is at least one or any combination of Ni, Pd, Ti, Ag, Au, Al, Sn, Sb, Cr and Mo.

Wherein the step before annealing the substrate at the first time further comprises:
  pattern the metal catalyst layer.

Wherein the step after annealing the substrate at the second time further comprises:
  pattern the polycrystalline silicon layer.

In order to solve the above issues, the present invention further provides a polycrystalline silicon substrate which is produced by the manufacturing method of the polycrystalline silicon substrate, the manufacturing method comprises: provide a substrate; sequentially form an amorphous silicon layer, an insulating layer and a metal catalyst layer; anneal the substrate at the first time, so that metal ions of the metal catalyst layer extend down to the amorphous silicon layer through the insulating layer, thereby inducing the amorphous silicon on the amorphous silicon layer to crystallize at the first time; remove the insulating layer and the metal catalyst layer; anneal the substrate at the second time, so that the metal ions lateral diffuse along the amorphous silicon layer, thereby inducing the amorphous silicon on the amorphous silicon layer to crystallize at the second time, forming the polycrystalline silicon layer; wherein the step before annealing the substrate at the first time further comprises: pattern the metal catalyst layer; wherein the step after annealing the substrate at the second time further comprises: pattern the polycrystalline silicon layer.

Wherein the first annealing temperature is 500-600° C.

Wherein the second annealing temperature is 500-600° C.

Wherein the step before sequentially forming an amorphous silicon layer, an insulating layer and a metal catalyst layer further comprises: form a buffer layer on the substrate; the step of sequentially forming an amorphous silicon layer, an insulating layer and a metal catalyst layer comprises: form the amorphous silicon layer, the insulating layer and the metal catalyst layer on the buffer layer.

Wherein the buffer layer is at least one or any combination of the silicon oxide, silicon nitride and silicon oxynitride.

Wherein the insulating layer is at least one or any combination of the silicon oxide, silicon nitride and silicon oxynitride.

Wherein the metal catalyst layer is at least one or any combination of Ni, Pd, Ti, Ag, Au, Al, Sn, Sb, Cr and Mo.

Wherein the step before annealing the substrate at the first time further comprises: pattern the metal catalyst layer.

Wherein the step after annealing the substrate at the second time further comprises: pattern the polycrystalline silicon layer.

Through the above solutions, the benefits of the present invention are: to be distinguished from the prior art, the present invention anneals the substrate at the first time after sequentially forming an amorphous silicon layer, an insulating layer and a metal catalyst layer, so that metal ions of the metal catalyst layer extend down to the amorphous silicon layer through the insulating layer, thereby inducing the amorphous silicon on the amorphous silicon layer to crystallize at the first time, and then removing the insulating layer and the metal catalyst layer, annealing the substrate at the second time, so that the metal ions lateral diffuse along the amorphous silicon layer, thereby inducing the amorphous silicon on the amorphous silicon layer to crystallize at the second time, forming the polycrystalline silicon layer. Whereby making the most of the metal ions eventually converge on the edge of both ends of the polycrystalline silicon layer, thus follow-up process can remove the most of the metal ions after patterning the polycrystalline silicon, reducing the metal ion residues, decreasing the leakage current of the semiconductor layer in the thin film transistor, thereby raising the performance of the thin film transistor.

BRIEF DESCRIPTION OF THE DRAWINGS

In order to more clearly describe the technical solutions in the embodiment of the present invention, the following will briefly describe the drawings required by the embodiments; obviously, the following drawings are only several embodiments of the present invention, for those ordinary technical personnel, they can obtain other drawings according to these drawings under the premise of not paying creative labor. Wherein.

DETAILED DESCRIPTION OF THE PREFERRED EMBODIMENTS

The following will combine the drawings in the embodiment of the present invention to clearly and fully describe the technical solution in the embodiments of the present invention; obviously, the described embodiments are merely one region embodiment instead of wide-region embodiment of the present invention. According to the embodiments of the present invention, the other embodiments obtained by the ordinary technical personnel under the premise of not paying creative labor all belong to the protecting scope of the present invention.

Figure 1:
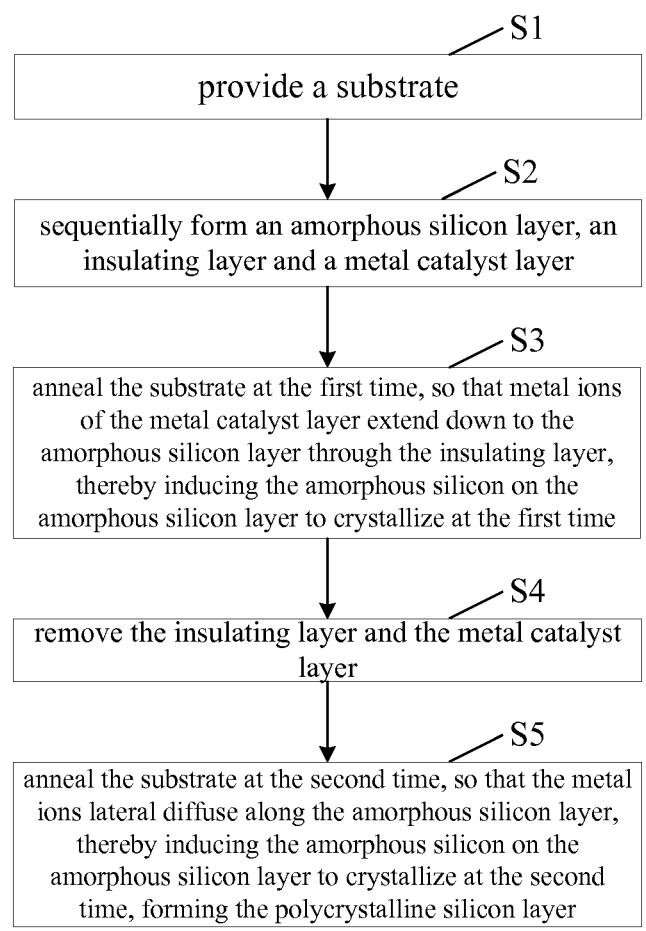
FIG. 1 is a flowchart of a manufacturing method of a polycrystalline silicon substrate provided by the embodiment of the present invention.
Figure 2:
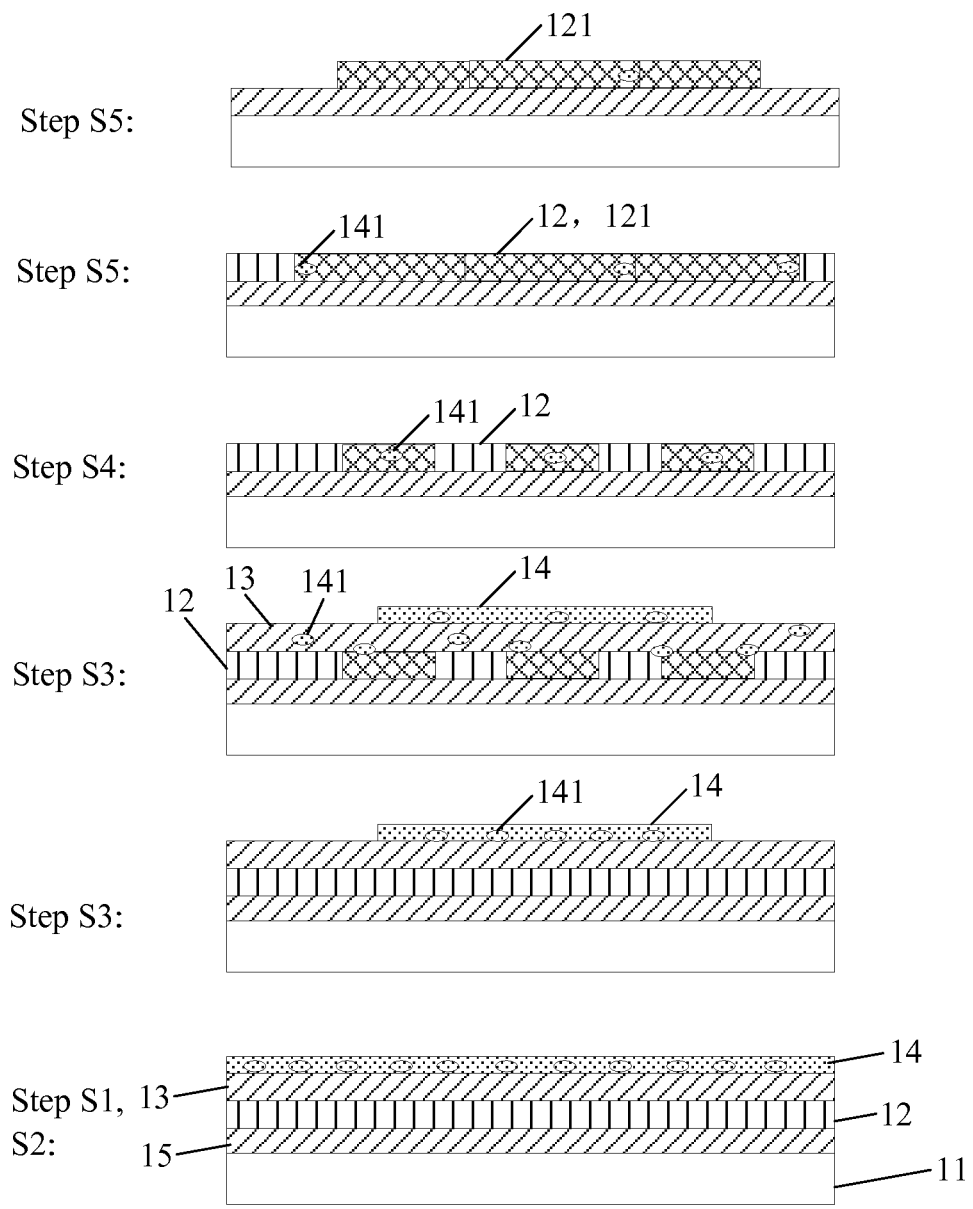
FIG. 2 is a technology process diagram corresponding to the method shown in FIG. 1.

Refer to FIG. 1, FIG. 1 is a flowchart of a manufacturing method of a polycrystalline silicon substrate provided by the embodiment of the present invention. As shown in FIG. 1, the manufacturing method of the present invention comprises the following steps:

Step S1: provide a substrate 11.

Wherein the material of the substrate 11 could be glass, plastic or steel. The present step also carries on the process of cleaning, drying and so on in order to ensure cleanliness of the substrate 11.

Step S2: sequentially form an amorphous silicon layer 12, an insulating layer 13 and a metal catalyst layer 14.

Before this step, there is a buffer layer 15 formed on the substrate 11. The buffer layer 15 is at least one or any combination of the silicon oxide (SiOx), silicon nitride (SiNx) and silicon oxynitride (SiOxNy).

Specifically, the present step is to form the amorphous silicon layer 12, the insulating layer 13 and the metal catalyst layer 14 on the buffer layer. Wherein the insulating layer 13 is an oxide and/or a nitride; specifically, the insulating layer 13 is at least one or any combination of the silicon oxide, silicon nitride and silicon oxynitride. The metal catalyst layer 14 is at least one or any combination of Ni, Pd, Ti, Ag, Au, Al, Sn, Sb, Cr and Mo.

Step S3: anneal the substrate 11 at the first time, so that metal ions 141 of the metal catalyst layer 14 extends down to the amorphous silicon layer 12 through the insulating layer, thereby inducing the amorphous silicon on the amorphous silicon layer 12 to crystallize at the first time.

In the present step, patterning the metal catalyst layer 14 before the first annealing of the substrate 11. It can reduce the concentration of the diffused metal ion 141.

The present step can achieve thermal annealing through CVD (Chemical Vapor Deposition) or RTA (Rapid Thermal Annealing). In a period of time, the metal ions 141 of the metal catalyst layer 14 extend down to the amorphous silicon layer 12 under the heating circumstance, the metal ion mainly use the theory of SGS or MIC (Metal Induced Crystallization) to induce the amorphous silicon on the amorphous silicon layer to crystallize at the first time.

Wherein the first annealing temperature of the present step is 500-600° C.

Step S4: remove the insulating layer 13 and the metal catalyst layer 14. Preferably use the etching way to remove the insulating layer 13 and the metal catalyst layer 14.

Step S5: anneal the substrate 11 at the second time, so that the metal ions 141 lateral diffuse along the amorphous silicon layer 12, thereby inducing the amorphous silicon on the amorphous silicon layer 12 to crystallize at the second time, forming the polycrystalline silicon layer 121.

Because the activation energy of amorphous silicon of the amorphous silicon layer 12 is lower, the metal ion 141 will continuously react with the silicon atoms of the amorphous silicon to form the metal silicide, crystallizing the amorphous silicon; moreover, the metal ion 141 only reacts with the silicon atom of the amorphous silicon instead of the silicon atom of the polycrystalline silicon, this is MILC (Metal-Induced Lateral Crystallization) theory. Therefore, base on MILC theory, the present step anneals the substrate 11 at the second time; specifically, using MILC theory to make the metal ion 141 continuously induce the amorphous silicon on the amorphous silicon layer 12 to crystallize at the second time, forming the polycrystalline silicon layer. The crystal grain gradually grows up, at the same time, the metal ion lateral diffuses to the amorphous silicon layer 12. So that the most metal ions 141 will eventually be gathered on the edge of the amorphous silicon layer 12.

Wherein the second annealing temperature is 500-600° C.

In the present invention, after the secondary crystallization of the amorphous silicon by annealing the substrate 11 at the second time, further patterning the crystalized polycrystalline silicon layer 121; specifically, removing the edge part of the polycrystalline silicon layer 121, thus the metal ions 141 diffusing into the edge of the polycrystalline silicon layer 121 can be removed, thereby achieving the effect of reducing the metal ion residues.

Figure 3:
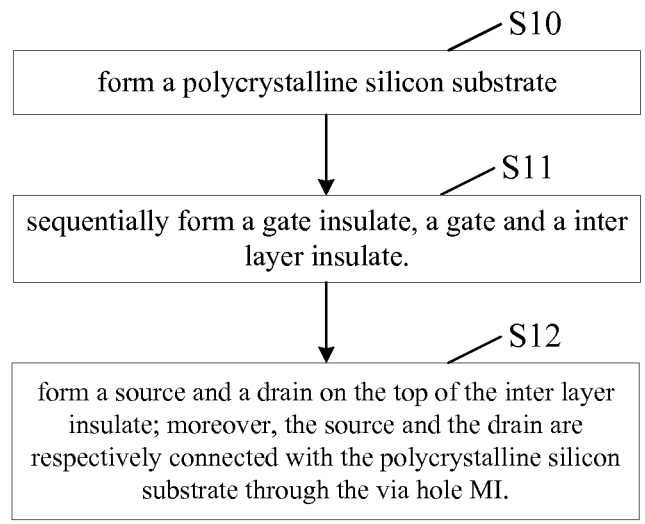
FIG. 3 is a flowchart of a manufacturing method of a TFT transistor provided by the embodiment of the present invention.
Figure 4:
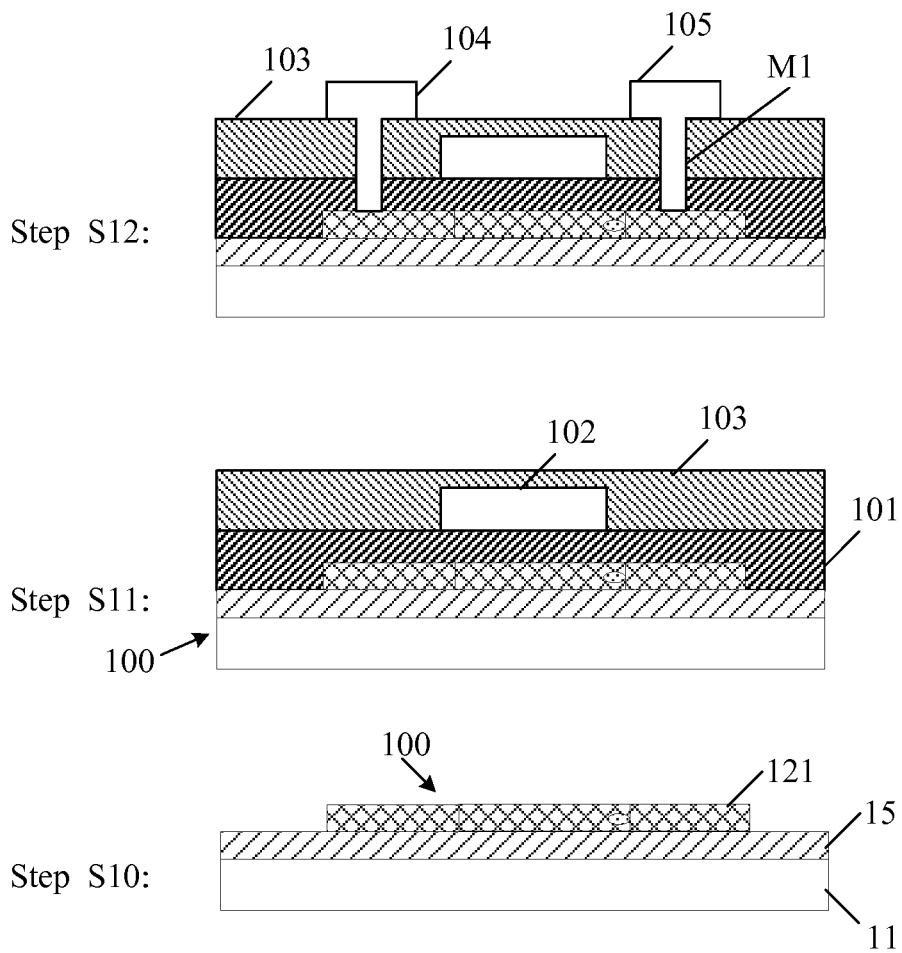
FIG. 4 is a technology process diagram corresponding to the method shown in FIG. 3.

The present invention also provides a manufacturing method of a TFT transistor, the specific description is shown in FIG. 3 and FIG. 4. Wherein FIG. 3 is a flowchart of a manufacturing method of a TFT transistor provided by the embodiment of the present invention, FIG. 4 is a technology process diagram corresponding to the method shown in FIG. 3.

As shown in FIG. 3 and FIG. 4, the manufacturing method of TFT (Thin Film Transistor) comprises the following steps:

Step 100: form a polycrystalline silicon substrate 100.

Specifically, sequentially form a buffer layer 15 and a polycrystalline silicon layer 121 on the substrate 11. Wherein the specific forming process of the polycrystalline silicon substrate 100 is the same with the above description, there is no more description.

Step S11: sequentially form a gate insulate 101, GI, a gate 102 and a inter layer insulate 103, ILD.

Step S12: form a source 104 and a drain 105 on the top of the inter layer insulate; moreover, the source 104 and the drain 105 are respectively connected with the polycrystalline silicon substrate through the via hole MI.

The present invention also provides a TFT transistor base on the method mentioned above, the specific description is shown in FIG. 5.

Figure 5:
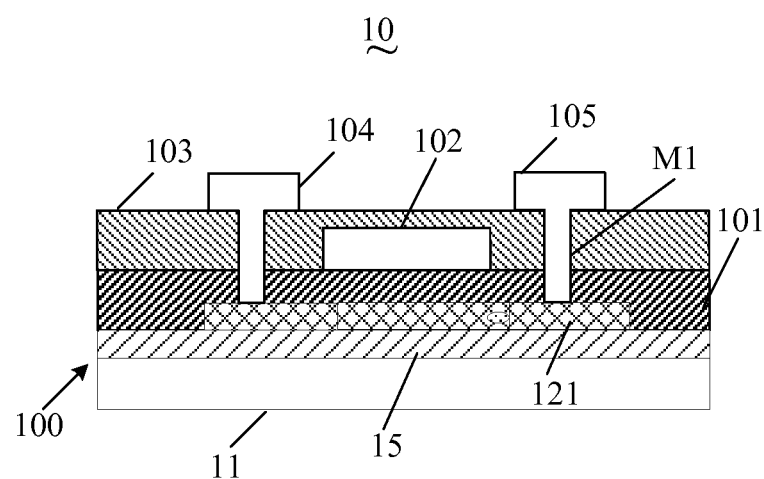
FIG. 5 is a structure diagram of a TFT transistor provided by the embodiment of the present invention.

As shown in FIG. 5, the present invention provides a TFT transistor 10 which comprises a polycrystalline silicon substrate 100, a gate insulate 101, a gate 102, a inter layer insulate 103, a source 104 and a drain 105.

Wherein the polycrystalline silicon substrate 100 is produced by the manufacturing method mentioned above. The polycrystalline silicon substrate 100 comprises a substrate 11, a buffer 15 and a polycrystalline silicon layer 121. The buffer layer 15 is disposed on the substrate 11, the polycrystalline silicon layer 121 is disposed on the buffer layer 15. The gate insulate 101, the gate 102, the inter layer insulate 103 are sequentially formed on the polycrystalline silicon substrate 100. The source 104 and the drain 105 are disposed on the inter layer insulate 103, and are electrically connected with the polycrystalline silicon layer 121 through crossing the via hole MI of the gate insulate 101 and the inter layer insulate 103.

In summary, the present can reduce the metal catalyst residues during forming the polycrystalline silicon layer, decreasing the leakage current of the semiconductor layer in the thin film transistor, thereby raising the performance of the thin film transistor.

The preferred embodiments according to the present invention are mentioned above, which cannot be used to define the scope of the right of the present invention. Those variations of equivalent structure or equivalent process according to the present specification and the drawings or directly or indirectly applied in other areas of technology are considered encompassed in the scope of protection defined by the claims of the present invention.

What is claimed is:

1. A manufacturing method of a polycrystalline silicon substrate, comprising:
providing a substrate;
sequentially forming an amorphous silicon layer, an insulating layer and a metal catalyst layer on the substrate;
conducting a first annealing operation at a first annealing temperature on the substrate so that metal ions of the metal catalyst layer extend down into amorphous silicon of a portion of the amorphous silicon layer through the insulating layer, thereby inducing primary crystallization in the amorphous silicon of the portion of the amorphous silicon layer to convert the amorphous silicon of the portion of the amorphous silicon layer into polycrystalline silicon;
removing the insulating layer and the metal catalyst layer; and
conducting a second annealing operation at a second annealing temperature on the substrate so that the metal ions extending into the portion of the amorphous silicon layer laterally diffuse along a remaining portion of the amorphous silicon layer, wherein the metal ions induce secondary crystallization in amorphous silicon of the remaining portion of the amorphous silicon layer to convert the amorphous silicon of the remaining portion of the amorphous silicon layer into polycrystalline silicone, thereby changing the amorphous silicon layer into a polycrystalline silicon layer, wherein the metal ions induce the secondary crystallization laterally along the remaining portion of the amorphous silicon layer to reach an end of the remaining portion and thus gathers at an end portion of the polycrystalline silicon layer that corresponds to the end of the remaining portion of the amorphous silicon layer;
wherein a step of patterning the metal catalyst layer is conducted before conducting a first annealing operation on the substrate; and
wherein a step of patterning the polycrystalline silicon layer is conducted after conducting a second annealing operation on the substrate in order to remove the end portion of the polycrystalline silicon layer and thus remove the metal ions gathering in the end portion of the polycrystalline silicon layer.

2. The manufacturing method as claimed in claim 1, wherein a step of forming a buffer layer on the substrate is conducted before sequentially forming an amorphous silicon layer, an insulating layer and a metal catalyst layer on the substrate; and
the step of sequentially forming an amorphous silicon layer, an insulating layer and a metal catalyst layer on the substrate comprises:
forming the amorphous silicon layer, the insulating layer and the metal catalyst layer on the buffer layer.

3. A manufacturing method of a polycrystalline silicon substrate, comprising:
providing a substrate;
sequentially forming an amorphous silicon layer, an insulating layer and a metal catalyst layer on the substrate;
conducting a first annealing operation at a first annealing temperature on the substrate so that metal ions of the metal catalyst layer extend down into amorphous silicon of a portion of the amorphous silicon layer through the insulating layer, thereby inducing primary crystallization in the amorphous silicon of the portion of the amorphous silicon layer to convert the amorphous silicon of the portion of the amorphous silicon layer into polycrystalline silicon;
removing the insulating layer and the metal catalyst layer; and
conducting a second annealing operation at a second annealing temperature on the substrate so that the metal ions extending into the portion of the amorphous silicon layer laterally diffuse along a remaining portion of the amorphous silicon layer, wherein the metal ions induce secondary crystallization in amorphous silicon of the remaining portion of the amorphous silicon layer to convert the amorphous silicon of the remaining portion of the amorphous silicon layer into polycrystalline silicone, thereby changing the amorphous silicon layer into a polycrystalline silicon layer, wherein the metal ions induce the secondary crystallization laterally along the remaining portion of the amorphous silicon layer to reach an end of the remaining portion and thus gathers at an end portion of the polycrystalline silicon layer that corresponds to the end of the remaining portion of the amorphous silicon layer;

wherein a step of patterning the polycrystalline silicon layer is conducted after conducting a second annealing operation on the substrate in order to remove the end portion of the polycrystalline silicon layer and thus remove the metal ions gathering in the end portion of the polycrystalline silicon layer.

4. The manufacturing method as claimed in claim 3, wherein the first annealing temperature is 500-600° C.

5. The manufacturing method as claimed in claim 3, wherein the second annealing temperature is 500-600° C.

6. The manufacturing method as claimed in claim 3, wherein a step of forming a buffer layer on the substrate is conducted before sequentially forming an amorphous silicon layer, an insulating layer and a metal catalyst layer fur on the substrate; and the step of sequentially forming an amorphous silicon layer, an insulating layer and a metal catalyst layer on the substrate comprises:

forming the amorphous silicon layer, the insulating layer and the metal catalyst layer on the buffer layer.

7. The manufacturing method as claimed in claim 6, wherein the buffer layer is formed of at least one of silicon oxide, silicon nitride and silicon oxynitride, or a combination thereof.

8. The manufacturing method as claimed in claim 3, wherein the insulating layer is formed of at least one of silicon oxide, silicon nitride and silicon oxynitride, or a combination thereof.

9. The manufacturing method as claimed in claim 3, wherein the metal catalyst layer is formed of at least one of Ni, Pd, Ti, Ag, Au, Al, Sn, Sb, Cr and Mo, or a combination thereof.

10. The manufacturing method as claimed in claim 3, wherein a step of patterning the metal catalyst layer is conducted before conducting a first annealing operation on the substrate.

11. A polycrystalline silicon substrate, which is manufactured with the following steps:

providing a substrate;

sequentially forming an amorphous silicon layer, an insulating layer and a metal catalyst layer on the substrate;

conducting a first annealing operation at a first annealing temperature on the substrate so that metal ions of the metal catalyst layer extend down into amorphous silicon of a portion of the amorphous silicon layer through the insulating layer, thereby inducing primary crystallization in the amorphous silicon of the portion of the amorphous silicon layer to convert the amorphous silicon of the portion of the amorphous silicon layer into polycrystalline silicon;

removing the insulating layer and the metal catalyst layer; and conducting a second annealing operation at a second annealing temperature on the substrate so that the metal ions extending into the portion of the amorphous silicon layer laterally diffuse along a remaining portion of the amorphous silicon layer, wherein the metal ions induce secondary crystallization in amorphous silicon of the remaining portion of the amorphous silicon layer to convert the amorphous silicon of the remaining portion of the amorphous silicon layer into polycrystalline silicone, thereby changing the amorphous silicon layer into a polycrystalline silicon layer, wherein the metal ions induce the secondary crystallization laterally along the remaining portion of the amorphous silicon layer to reach an end of the remaining portion and thus gathers at an end portion of the polycrystalline silicon layer that corresponds to the end of the remaining portion of the amorphous silicon layer;

wherein a step of patterning the polycrystalline silicon layer is conducted after conducting a second annealing operation on the substrate in order to remove the end portion of the polycrystalline silicon layer and thus remove the metal ions gathering in the end portion of the polycrystalline silicon layer.

12. The polycrystalline silicon substrate as claimed in claim 11, wherein the first annealing temperature is 500–600° C.

13. The polycrystalline silicon substrate as claimed in claim 11, wherein the second annealing temperature is 500–600° C.

14. The polycrystalline silicon substrate as claimed in claim 11, wherein a step of forming a buffer layer on the substrate is conducted before sequentially forming an amorphous silicon layer, an insulating layer and a metal catalyst layer fur on the substrate; and the step of sequentially forming an amorphous silicon layer, an insulating layer and a metal catalyst layer on the substrate comprises:

forming the amorphous silicon layer, the insulating layer and the metal catalyst layer on the buffer layer.

15. The polycrystalline silicon substrate as claimed in claim 14, wherein the buffer layer is formed of at least one of silicon oxide, silicon nitride and silicon oxynitride, or a combination thereof.

16. The polycrystalline silicon substrate as claimed in claim 11, wherein the insulating layer is formed of at least one of silicon oxide, silicon nitride and silicon oxynitride, or a combination thereof.

17. The polycrystalline silicon substrate as claimed in claim 11, wherein the metal catalyst layer is formed of at least one of Ni, Pd, Ti, Ag, Au, Al, Sn, Sb, Cr and Mo, or a combination thereof.

18. The polycrystalline silicon substrate as claimed in claim 11, wherein a step of patterning the metal catalyst layer is conducted before conducting a first annealing operation on the substrate.

* * * * *